(12) United States Patent
Amano et al.

(10) Patent No.: US 9,782,807 B2
(45) Date of Patent: Oct. 10, 2017

(54) SUBSTRATE PROCESSING SYSTEM, METHOD FOR CONTROLLING SUBSTRATE PROCESSING SYSTEM, AND STORAGE MEDIUM

(71) Applicant: Tokyo Electron Limited, Tokyo (JP)

(72) Inventors: Yoshifumi Amano, Kumamoto (JP); Yuki Ito, Kumamoto (JP); Eiichiro Okamoto, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 529 days.

(21) Appl. No.: 14/314,188

(22) Filed: Jun. 25, 2014

(65) Prior Publication Data
US 2015/0013722 A1 Jan. 15, 2015

(30) Foreign Application Priority Data
Jul. 9, 2013 (JP) .................................. 2013-143285

(51) Int. Cl.
*H01L 21/67* (2006.01)
*B08B 13/00* (2006.01)

(52) U.S. Cl.
CPC ........ *B08B 13/00* (2013.01); *H01L 21/67051* (2013.01); *H01L 21/67259* (2013.01)

(58) Field of Classification Search
CPC ............... B08B 13/00; H01L 21/67051; H01L 21/67259
USPC ........................................................ 134/902
See application file for complete search history.

(56) References Cited

U.S. PATENT DOCUMENTS

2015/0012124 A1* 1/2015 Hiroki ............... H01L 21/67196
700/121

FOREIGN PATENT DOCUMENTS

| JP | 2003-136015 A | | 5/2003 | |
| JP | 2003136015 A | * | 5/2003 | |
| JP | 2013206962 A | * | 10/2013 | ....... H01L 21/67196 |
| TW | 200402825 A | | 2/2004 | |
| TW | 200732046 A | | 9/2007 | |
| TW | 200831194 A | | 8/2008 | |

\* cited by examiner

*Primary Examiner* — Douglas Lee
(74) *Attorney, Agent, or Firm* — Abelman, Frayne & Schwab

(57) ABSTRACT

Disclosed is a substrate processing system including a substrate processing apparatus that includes a nozzle configured to eject a processing liquid to a substrate. The system includes a jig sensor configured to detect whether a checking jig provided with a liquid receiving unit receiving the processing liquid ejected from the nozzle and configured to check an ejection state of the processing liquid from the nozzle is installed at a predetermined position of the substrate processing apparatus; and a controller configured to control the ejection of the processing liquid from the nozzle. When it is determined that the checking jig is installed at the predetermined position of the substrate processing apparatus based on detection of the jig sensor in a state where the ejection of the processing liquid from the nozzle is prohibited, the controller permits the ejection of the processing liquid from the nozzle.

8 Claims, 8 Drawing Sheets

FIG.12A   FIG.12B
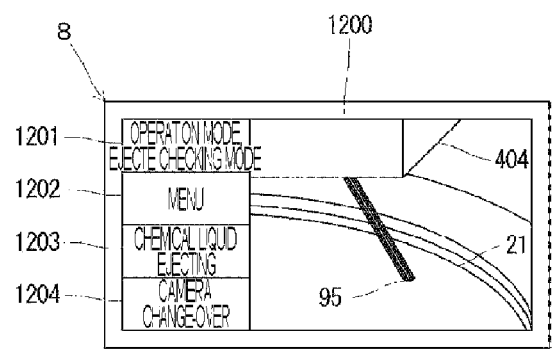
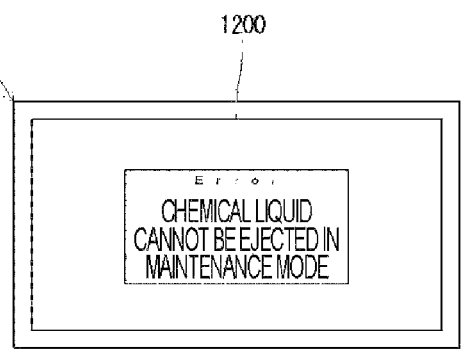
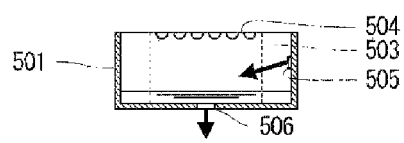
FIG.13A
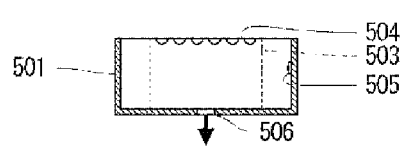
FIG.13B
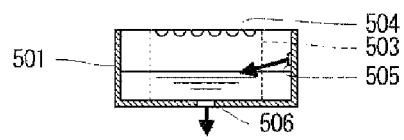
FIG.13C
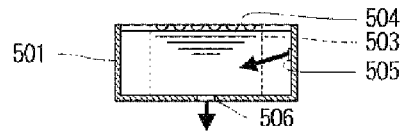
FIG.13D
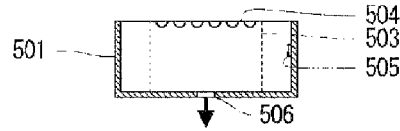
FIG.13E

SUBSTRATE PROCESSING SYSTEM, METHOD FOR CONTROLLING SUBSTRATE PROCESSING SYSTEM, AND STORAGE MEDIUM

CROSS-REFERENCE TO RELATED APPLICATIONS

This application is based on and claims priority from Japanese Patent Application No. 2013-143285, filed on Jul. 9, 2013, with the Japan Patent Office, the disclosure of which is incorporated herein in its entirety by reference.

TECHNICAL FIELD

The present disclosure relates to a substrate processing system in which a substrate such as a semiconductor wafer or a glass substrate for a flat panel display is processed by a processing liquid.

BACKGROUND

A substrate processing system including a single substrate processing apparatus is known. The single substrate processing apparatus rotatably holds a substrate around a vertical axis and rotates the substrate to supply various processing liquids to a target surface of the substrate from a nozzle. In order to normally actuate the substrate processing system, a user needs to check that the nozzle of each substrate processing apparatus appropriately ejects the processing liquids. In Japanese Patent Laid-Open Publication No. 2003-136015, a CCD camera that photographs the processing liquid ejected from the nozzle and a container that receives the ejected processing liquid are installed in a processing chamber of the substrate processing apparatus to check an ejection state of the processing liquid from a photographed image of the CCD camera.

SUMMARY

According to an aspect, the present disclosure provides a substrate processing system including a substrate processing apparatus that includes a nozzle configured to eject a processing liquid to a substrate, and a checking jig provided with a liquid receiving unit receiving the processing liquid ejected from the nozzle and configured to check an ejection state of the processing liquid from the nozzle. The system includes a jig sensor configured to detect whether the checking jig is installed at a predetermined position of the substrate processing apparatus; and a controller configured to control the ejection of the processing liquid from the nozzle. When the controller determines that the checking jig is installed at the predetermined position of the substrate processing apparatus based on detection of the jig sensor in a state where the ejection of the processing liquid from the nozzle is prohibited, the controller permits the ejection of the processing liquid from the nozzle.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 12A and 12B are front views illustrating an example of a display screen of an operation panel.

FIGS. 13A to 13E are explanatory views illustrating a washing sequence of a front nozzle liquid receiving portion.

DETAILED DESCRIPTION

Figure 1:
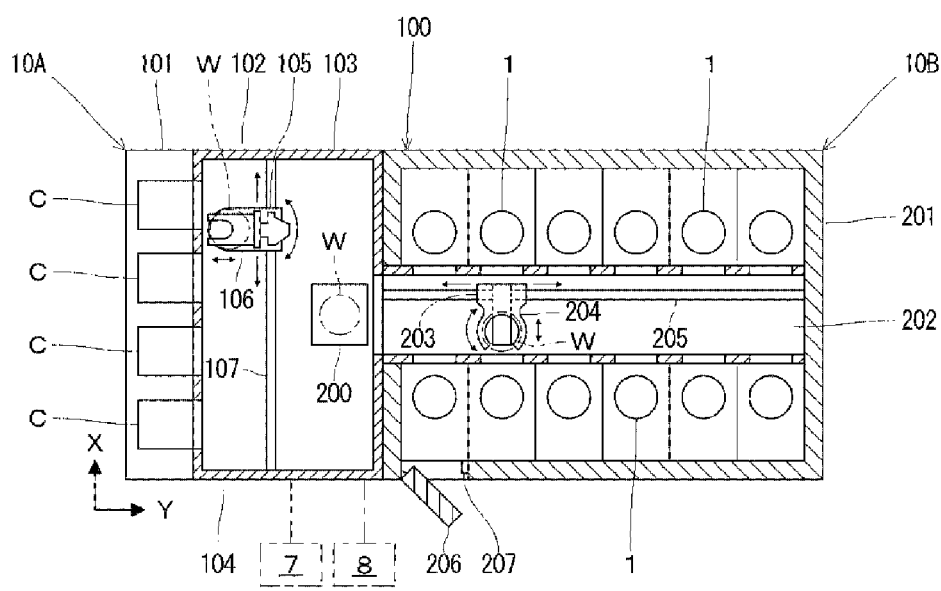
FIG. 1 is a plan view illustrating a schematic configuration of a substrate processing system according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In Japanese Patent Laid-Open Publication No. 2003-136015, since the container receiving the ejected processing liquid needs to be installed in the processing chamber in advance, the apparatus is enlarged. In order to avoid the problem, there is also a technique in which a checking jig having a container is prepared separately from the substrate processing apparatus, and a user installs the checking jig in the processing chamber of the apparatus as necessary. Since the substrate processing system can prohibit the processing liquid from being ejected from the nozzle, the user sets the system in the prohibition state and thereafter, installs the checking jig in the processing chamber and cancels the setting of the prohibition state after installing the jig. However, in this technique, for example, when the user is not skilled, and as a result, the user cannot normally install the checking jig, the setting of the prohibition state is cancelled and thereafter, the processing liquid may be ejected to an unintended place in the processing chamber.

The present disclosure is contrived to solve the aforementioned problem and ejecting the processing liquid from the nozzle can be simply and certainly checked without causing the enlargement of the apparatus.

According to an aspect, the present disclosure provides a substrate processing system including a substrate processing apparatus that includes a nozzle configured to eject a processing liquid to a substrate, and a checking jig provided with a liquid receiving unit receiving the processing liquid ejected from the nozzle and configured to check an ejection state of the processing liquid from the nozzle. The system includes a jig sensor configured to detect whether the checking jig is installed at a predetermined position of the substrate processing apparatus; and a controller configured to control the ejection of the processing liquid from the nozzle. When the controller determines that the checking jig is installed at the predetermined position of the substrate processing apparatus based on detection of the jig sensor in a state where the ejection of the processing liquid from the nozzle is prohibited, the controller permits the ejection of the processing liquid from the nozzle.

In the above-mentioned system, the controller is capable of changing an operation mode between a maintenance mode that prohibits the ejection of the processing liquid from the nozzle to perform a maintenance of the inside of the substrate processing apparatus and an ejection checking mode that permits the ejection of the processing liquid from the nozzle to check an ejection state of the processing liquid from the nozzle, and when it is detected by the jig sensor that the checking jig is installed at the predetermined position of the substrate processing apparatus in a state where the operation mode is set to the maintenance mode, the controller changes the operation mode from the maintenance mode to the ejection checking mode to permit the ejection of the processing liquid from the nozzle.

In the above-mentioned system, wherein the substrate processing apparatus further includes an opening/closing panel and an opening/closing sensor configured to detect an opening/closing of the opening/closing panel, and when the controller determines that the checking jig is installed at the predetermined position of the substrate processing apparatus based on the detection of the jig sensor in the state where the operation mode is set to the maintenance mode and determines that the opening/closing panel is closed based on the detection of the opening/closing sensor, the controller changes the operation mode from the maintenance mode to the ejection checking mode.

In the above-mentioned system, when the controller detects that the opening/closing panel is opened by the opening/closing sensor in a state where the operation mode is set to the ejection checking mode, the controller changes the operation mode from the ejection checking mode to the maintenance mode.

In the above-mentioned system, the substrate processing apparatus further includes an operation device for a user to operate the ejection of the processing liquid and the controller controls the ejection of the processing liquid from the nozzle according to an operation input from the operation device in the ejection checking mode.

In the above-mentioned system, the checking jig is provided with a camera for photographing the ejection state of the processing liquid from the nozzle and the controller displays an image acquired by the camera on the operation device in the ejection checking mode.

In the above-mentioned system, the substrate processing apparatus is provided with a back nozzle configured to eject the processing liquid to the bottom of the substrate, and the camera photographs the back nozzle at the time of installing the checking jig.

In the above-mentioned system, the checking jig is further provided with a jig-side corresponding sensor corresponding to the jig sensor, and when the checking jig is installed at the predetermined position of the substrate processing apparatus, the liquid receiving portion is positioned in an ejection direction of the processing liquid from the nozzle and the jig-side corresponding sensor faces the jig sensor.

According to another aspect, the present disclosure provides a method for controlling a substrate processing system including a substrate processing apparatus that includes a nozzle configured to eject a processing liquid to a substrate, and a checking jig provided with a liquid receiving unit receiving the processing liquid ejected from the nozzle and configured to check an ejection state of the processing liquid from the nozzle by using a checking jig. The method includes determining whether the checking jig is installed at a predetermined position of the substrate processing apparatus; and permitting the ejection of the processing liquid from the nozzle when it is determined that the checking jig is installed at the predetermined position of the substrate processing apparatus by the determining in a state where the ejection of the processing liquid from the nozzle is prohibited.

According to still another aspect, the present disclosure provides a storage medium storing a control program of a substrate processing system including a substrate processing apparatus that includes a nozzle configured to eject a processing liquid to a substrate, and a checking jig provided with a liquid receiving unit receiving the processing liquid ejected from the nozzle and configured to check an ejection state of the processing liquid from the nozzle. The control program includes determining whether the checking jig is installed at a predetermined position of the substrate processing apparatus; and permitting the ejection of the processing liquid of the nozzle when it is determined that the checking jig is installed at the predetermined position of the substrate processing apparatus by the determining in a state where the ejection of the processing liquid from the nozzle is prohibited.

According to the present disclosure, an ejection of the processing liquid from the nozzle may be simply and certainly checked without causing an enlargement of the apparatus.

Hereinafter, exemplary embodiments of the present disclosure will be described with reference to FIGS. 1 to 14.

On a wafer W (substrate) processed by a substrate processing apparatus 1 according to an exemplary embodiment, a layer made of, for example, SiN is formed, and the layer is formed over a peripheral portion of a lower surface of the wafer W through a side end of the wafer W from an upper surface of the wafer W. Here, the substrate processing apparatus 1 is configured to remove a layer positioned at the peripheral portion of the wafer W of the layer formed on the wafer W, by supplying a chemical liquid to the wafer W. First, a substrate processing system 100 including the substrate processing apparatus 1 will be described with reference to FIG. 1.

Meanwhile, the upper surface or the lower surface of the wafer W is a surface facing up or down when the wafer W is horizontally held by a substrate holding portion 21 to be described below. Further, the peripheral portion of the wafer W means a region in which a circuit pattern of a semiconductor device is not formed, as a region around the side end of the wafer W.

FIG. 1 is a plan view illustrating a schematic configuration of the substrate processing system 100. As illustrated in FIG. 1, the substrate processing system 100 includes a carry-in/out station 10A in which a wafer carrier C accommodating a plurality of wafers W is installed to carry in and out the wafers W, and a processing station 10B for liquid-processing the wafers W. The carry-in/out station 10A and the processing station 10B are installed to be adjacent to each other.

The carry-in/out station 10A is provided with a carrier placing unit 101, a transport unit 102, and a transfer unit 103, and a housing 104. In the carrier placing unit 101, the wafer carrier C configured to accommodate a plurality of wafers W in a horizontal state is placed. In the transport unit 102, the wafers W are transported, and in the transfer unit 103, the wafers W are transferred. The transport unit 102 and the transfer unit 103 are accommodated in the housing 104.

The transport unit 102 is provided with a transport mechanism 105. The transport mechanism 105 is provided with a wafer holding arm 106 configured to hold the wafer W, and a mechanism configured to move the wafer holding arm 106 forward and backward. Although not illustrated, the transport mechanism 105 is further provided with a mechanism configured to move the wafer holding arm 106 along a horizontal guide 107 extending in an X direction in which the wafer carrier C is placed, a mechanism configured move the wafer holding arm 106 along a vertical guide which is installed in a vertical direction, and a mechanism configured to rotate the wafer holding arm 106 in a horizontal surface. The wafer W is transported between the wafer carrier C and the transfer unit 103 by the transport mechanism 105.

The transfer unit 103 is provided with a transfer shelf 200 having a plurality of placing units in which the wafers W are placed. The transfer unit 103 is configured to transfer the wafers W between the transfer unit 103 and the processing station 10B through the transfer shelf 200.

The processing station 10B is provided with a housing 201, a plurality of substrate processing apparatuses 1 accommodated in the housing 201, a transport chamber 202, and a transport mechanism 203 installed in the transport chamber 202. Below the plurality of substrate processing apparatuses 1, a mechanism for supplying a liquid or gas to each substrate processing apparatus 1 may be accommodated. In the exemplary embodiment, a rectangular closed space in which each substrate processing apparatus 1 is present is called a "processing chamber" in FIG. 1.

The transport mechanism 203 is provided with a wafer holding arm 204 configured to hold the wafer W, and a mechanism configured to move the wafer holding arm 204 forward and backward. Although not illustrated, the transport mechanism 203 is further provided with a mechanism configured to move the wafer holding arm 204 in a Y direction along a horizontal guide 205 installed in the transport chamber 202, a mechanism configured to move the wafer holding arm 204 along a vertical guide which is installed in a vertical direction, and a mechanism configured to rotate the wafer holding arm 204 in a horizontal surface. The wafer W is carried in and out to and from each substrate processing apparatus 1 by the transport mechanism 203.

In the substrate processing system 100, a controller 7 and an operation panel 8 (operation apparatus) are installed. The controller 7 functions to control the entire substrate processing system 100. Further, the operation panel 8 is a touch panel type of operation apparatus for inputting various operation commands by a user of the substrate processing system 100. Details of the controller 7 and the operation panel 8 will be described below. In the substrate processing apparatus 1, a maintenance panel 206 (opening and closing type panel) is installed, and is an opening and closing type panel used when the user performs operation or checking in the processing chamber. Further, in the maintenance panel 206, a transparent window (not illustrated) is installed so that the user of the system checks an internal portion of the substrate processing apparatus 1 with the naked eyes even in a closed state. An opening and closing sensor 207 is to detect opening and closing of the maintenance panel 206. In FIG. 1, it is illustrated that one substrate processing apparatus 1 is provided with the maintenance panel 206 and the opening and closing sensor 207, and in the exemplary embodiment, all twelve substrate processing apparatuses 1 which are illustrated are provided with the maintenance panel 206 and the opening and closing sensor 207.

Constituent elements when the substrate processing apparatus 1 is viewed from the upper surface will be described with reference to FIG. 2. In order to process the upper surface of the wafer W, the substrate processing apparatus 1 is provided with a first chemical liquid nozzle 73 configured to eject a first chemical liquid toward the upper surface of the wafer W, a second chemical liquid nozzle 83 configured to eject a second chemical liquid toward the upper surface of the wafer W, and a first rinse nozzle 76 and a second rinse nozzle 86 installed around the first chemical liquid nozzle 73 and the second chemical liquid nozzle 83, respectively and configured to eject a rinse liquid toward the upper surface of the wafer W. In the exemplary embodiment, the nozzles ejecting the processing liquid toward the upper surface of the wafer W from an upper position of the wafer W are collectively called a front nozzle.

Figure 2:
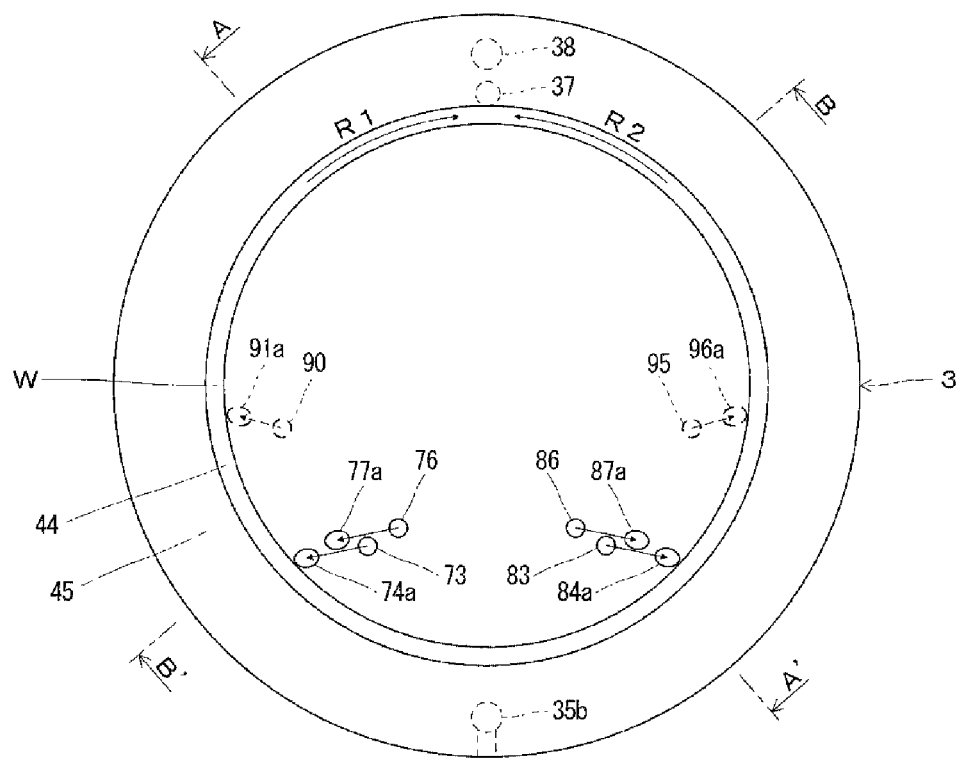
FIG. 2 is a plan view of a substrate processing apparatus.

As illustrated in FIG. 2, the substrate processing apparatus 1 further includes a cup body 3 installed to cover the wafer W at the side of the wafer W. The cup body 3 is provided with a cover portion 45 configured to receive the chemical liquid dispersed from the wafer W, and a fringe portion 44 configured to guide the chemical liquid dispersed from the wafer W to a liquid receiving space to be described below in the cup body 3. Further, in FIG. 2, a liquid ejection port 38 formed in the liquid receiving space in the cup body 3 and configured to eject the chemical liquid to the outside, and a carrier liquid supplying port 35b configured to supply a carrier liquid for facilitating a flow of the liquid to the liquid receiving space are illustrated by dotted lines, respectively.

The first chemical liquid and the second chemical liquid are different chemical liquids from each other. For example, the first chemical liquid may be an alkali chemical liquid such as a mixed solution (SC-1 liquid) of ammonia, hydrogen peroxide, and distilled water, and the second chemical liquid may be an acidic solution such as a mixed solution (HF liquid) of hydrofluoric acid and distilled water. Further, the rinse liquid may be a liquid which may wash out the remaining chemical liquid on the wafer W, for example, distilled water (DIW).

First, a reaching point and a direction of the liquid which is ejected from each of the chemical liquid nozzles 73 and 82 and each of the rinse nozzles 76 and 86 will be described. In FIG. 2, a region on the upper surface of the wafer W where the first chemical liquid ejected from the first chemical liquid nozzle 73 reaches is indicated by a solid line to which reference numeral 74a is designated, and a region on the upper surface of the wafer W where the rinse processing liquid ejected from the first rinse nozzle 76 reaches is indicated by a solid line to which reference numeral 77a is designated. Similarly, a region on the upper surface of the wafer W where the second chemical liquid ejected from the second chemical liquid nozzle 83 reaches is indicated by a solid line to which reference numeral 84a is designated, and a region on the upper surface of the wafer W where the rinse processing liquid ejected from the second rinse nozzle 86 reaches is indicated by a solid line to which reference numeral 87a is designated.

The liquids from the first chemical liquid nozzle 73 and the first rinse nozzle 76 are ejected while the wafer W rotates in a first rotation direction R1. Further, the liquids from the second chemical liquid nozzle 83 and the second rinse nozzle 86 are ejected while the wafer W rotates in a second rotation direction R2. Here, preferably, the first chemical liquid nozzle 73 and the first rinse nozzle 76 are formed so that ejection directions of the ejected first chemical liquid and rinse processing liquid are inclined in the first rotation direction R1. Here, "the ejection directions are inclined in the first rotation direction R1" means that a vector (an arrow staring from the first chemical liquid nozzle 73 and the first rinse nozzle 76 in FIG. 2) representing the ejection direction of the first chemical liquid and the rinse processing liquid has a component of the first rotation direction R1 of the wafer W. Similarly, the second chemical liquid nozzle 83 and the second rinse nozzle 86 are formed so that ejection directions of the ejected second chemical liquid and rinse processing liquid are inclined in the second rotation direction R2.

In order to liquid-process a lower surface of the wafer W, the substrate processing apparatus 1 further includes a third chemical liquid nozzle 90 ejecting the first chemical liquid toward the lower surface of the wafer W, and a fourth chemical liquid nozzle 95 ejecting the second chemical nozzle toward the lower surface of the wafer W. As the first chemical liquid and the second chemical liquid ejected from the third chemical liquid nozzle 90 and the fourth chemical liquid nozzle 95, the same liquids as the first chemical liquid and the second chemical liquid ejected from the first chemical liquid nozzle 73 and the second chemical liquid nozzle 83 described above are used. Meanwhile, a rinse processing liquid nozzle ejecting a rinse processing liquid toward the lower surface of the wafer W to be described below is omitted. In the exemplary embodiment, the nozzles ejecting the processing liquids toward the lower surface at a position under the wafer W are commonly called a back nozzle.

Next, a reaching point and a direction of the liquid ejected from each of the chemical liquid nozzles 90 and 95 will be described. In FIG. 2, a region on the lower surface of the wafer W where the first chemical liquid ejected from the third chemical liquid nozzle 90 reaches is indicated by a dotted line to which reference numeral 91a is designated, and a region on the lower surface of the wafer W where the second chemical liquid ejected from the fourth chemical liquid nozzle 95 reaches is indicated by a dotted line to which reference numeral 96a is designated.

The first chemical liquid from the third chemical liquid nozzle 90 is ejected together with the first chemical liquid from the first chemical liquid nozzle 73 while the wafer W rotates in the first rotation direction R1. Further, the second chemical liquid from the fourth chemical liquid nozzle 95 is ejected together with the second chemical liquid from the second chemical liquid nozzle 83 while the wafer W rotates in the second rotation direction R2. Here, preferably, the third chemical liquid nozzle 90 is formed so that the ejection direction of the ejected first chemical liquid is inclined in the first rotation direction R1. Similarly, the fourth chemical liquid nozzle 95 is formed so that the ejection direction of the ejected second chemical liquid is inclined in the second rotation direction R2.

Figure 3:
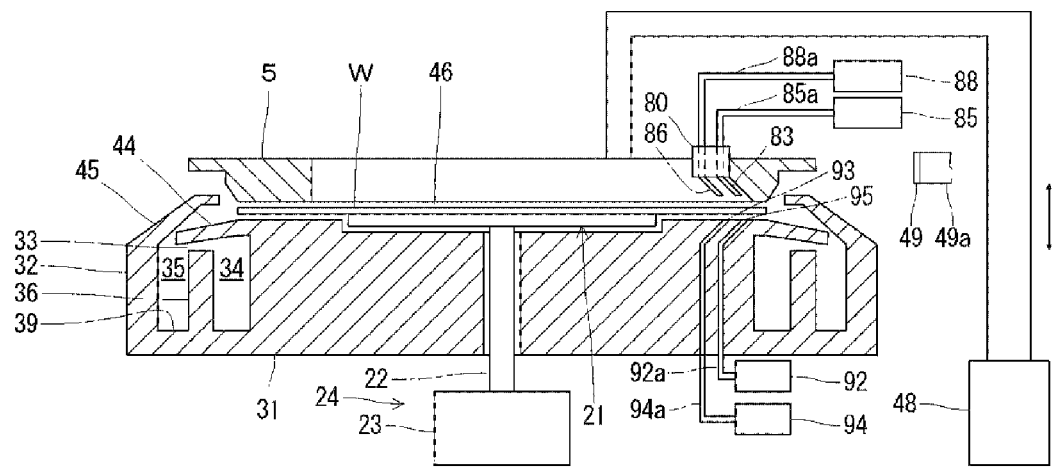
FIG. 3 is a longitudinal cross-sectional view of the substrate processing apparatus taken along line A-A'.

FIG. 3 is a longitudinal cross-sectional view of the substrate processing apparatus 1 illustrated in FIG. 2 viewed in an A-A' direction based on the left side. Meanwhile, in FIG. 3, for convenience of the description, in the longitudinal cross-sectional view of the substrate processing apparatus 1 viewed in the A-A' direction, all of the second chemical liquid nozzle 83, the second rinse nozzle 86, and the fourth chemical liquid nozzle 95 are illustrated.

As illustrated in FIG. 3, the substrate processing apparatus 1 includes a substrate holding unit 21 configured to horizontally hold the wafer W, a rotation driving unit 24 connected to the lower side of the substrate holding unit 21 and configured to rotate the substrate holding unit 21, the aforementioned cup body 3 installed to cover the side of the wafer W, and a cover member 5 installed to face the upper surface of the wafer W with a predetermined space. Hereinafter, respective constituent elements will be sequentially described.

The substrate holding unit 21 is configured to horizontally hold the wafer W without contacting the peripheral portion of the wafer W, and for example, the substrate holding unit 21 is configured as a vacuum chuck which adsorbs and holds the center of the lower surface of the wafer W. The rotation driving unit 24 is provided with a rotation driving shaft 22 configured to support the substrate holding unit 21, and a motor 23 configured to rotate the rotation driving shaft 22. The wafer W held on the substrate holding unit 21 may be rotated around a vertical shaft, by rotating the rotation driving shaft 22. Meanwhile, the rotation driving shaft 22 of the rotation driving unit 24 is configured to rotate in any direction of the first rotation direction R1 and the second rotation direction R2 which is opposite to the first rotation direction R1.

The cup body 3 is a ring-shaped member, and configured to laterally surround the substrate holding unit 21 and the side end of the wafer W and have an opening 46 into which the wafer W may be inserted. First, an internal structure of the cup body 3 will be described. As illustrated in FIG. 3, in the cup body 3, a groove portion 33 opened upward and extending in a circumferential direction is formed. The groove portion 33 is provided with a ring-shaped gas ejecting space 34 serving as a channel for ejecting gas generated during the liquid processing or gas flowing into the periphery of the wafer W to the outside, a gas ejection port 37 configured to communicate with the gas ejecting space 34, a ring-shaped liquid receiving space 35 serving as a channel for receiving the liquids such as the chemical liquid or the rinse processing liquid dispersed from the wafer W during the liquid processing to eject the liquids to the outside, and a liquid ejection port 38 communicating with the liquid receiving space 35. The gas ejecting space 34 and the liquid receiving space 35 are partitioned by a wall 36 formed at the groove portion 33. The wall 36 is configured to separate a liquid component dispersed in gases from the gases in the liquid receiving space 35. Further, as illustrated in FIG. 2, a carrier liquid supplying port 35b supplying a carrier liquid for facilitating a flow of the liquid to the liquid ejection port 38 to the liquid receiving space 35 is formed in the cup body 3. The gas flowing into the gas ejecting space 34 is ejected to the outside through the gas ejection port 37. Further, the liquid received by the liquid receiving space 35 is ejected from the liquid ejection port 38 to the outside.

Next, an appearance of the cup body 3 will be described. Here, a portion positioned inside of the groove portion 33 of the cup body 3 is defined as an inner circumference 31, and a portion positioned outside of the groove portion 33 of the cup body 3 is defined as an outer circumference 32. As illustrated in FIG. 3, the cup body 3 is provided with a fringe portion 44 extending from an upper end of the inner circumference 31 to the outside, and a cover portion 45 extending from the upper side of the fringe portion 44 to the inside from the upper end of the outer circumference 32. Among them, the fringe portion 44 is configured to guide the liquid dispersed from the wafer W or the gases from the periphery of the wafer W to the inside of the cup body 3. Further, the cover portion 45 receives the liquid dispersed from the rotating wafer W in the inner surface thereof to guide the received liquid to the inside of the cup body 3.

A structure of each constituent element for performing the processing above the wafer W will be described. As illustrated in FIG. 3, the second chemical liquid nozzle 83 and the second rinse nozzle 86 are supported by a nozzle driving unit 80 together. The nozzle driving unit 80 may integrally move the second chemical liquid nozzle 83 and the second rinse nozzle 86. A second chemical liquid supplying unit 85 supplying a second chemical liquid such as an HF liquid to the second chemical liquid nozzle 83 is connected to the second chemical liquid nozzle 83 through a supplying pipe 85a, and a rinse processing liquid supplying unit 88 supplying a rinse processing liquid such as DIW is connected to the second rinse nozzle 86 through a supplying pipe 88a. The nozzle driving unit 80 is attached to the cover member 5 as described below.

A structure of each constituent element for performing the processing under the wafer W will be described. As illustrated in FIG. 3, the fourth chemical liquid nozzle 95 and the fourth rinse nozzle 93 are formed in the cup body 3 together. A fourth chemical liquid supplying unit 92 configured to supply a second chemical liquid such as an HF liquid to the fourth chemical liquid nozzle 95 is connected to the fourth chemical liquid nozzle 95 through a supplying pipe 92a, and a rinse processing liquid supplying unit 94 configured to supply a rinse processing liquid such as DIW is connected to the fourth rinse nozzle 93 through a supplying pipe 94a.

The cover member 5 is disposed at the upper side of the opening 46 of the cup body 3 during the liquid processing, and has a ring shape. The cover member 5 is attached with an elevation mechanism 48 configured to move up and down the cover member 5. As a result, the cover member 5 may be close to the cup body 3 or far away from the cup body 3. In FIG. 3, the position of the cover member 5 during the liquid processing of the wafer W is illustrated. The gas from the top is easily received on the wafer W by forming the cover member 5 in the ring shape. A jig sensor 49 is installed at the outside of the cover member 5. The jig sensor 49 is fixedly supported by a supporter 49a which is fixed to the substrate processing apparatus 1 in the same method as the cup body 3 and the like, and is to detect installation of a checking jig to be described below.

In the exemplary embodiment, the vertically cross-sectional view viewed in an A-A' direction illustrated in FIG. 2 is described, but a vertically cross-sectional view viewed in a B-B' direction illustrated in FIG. 2 may be described to have the same configuration, and herein, the description thereof is omitted.

Figure 4:
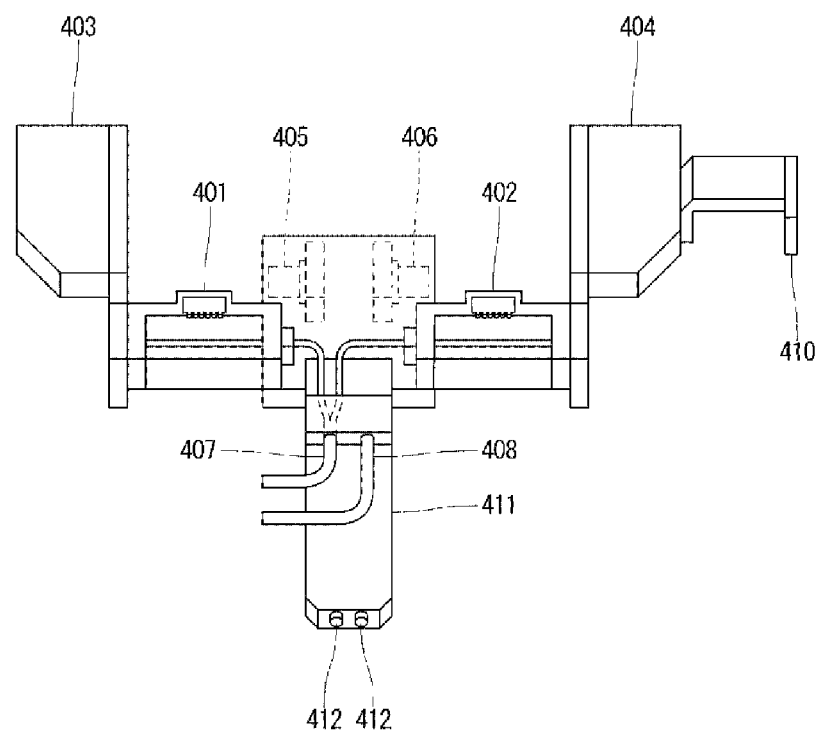
FIG. 4 is a perspective view illustrating an overall configuration of a checking jig.

FIG. 4 is a view illustrating an entire configuration of a checking jig 400 used to check an ejection state of the chemical liquid according to the exemplary embodiment. A front end of each nozzle of the substrate processing apparatus 1 illustrated in FIGS. 2 and 3 is thin, and as a result, the ejected chemical liquid needs to reach the substrate in a linear shape as it is. However, the chemical liquid is not leaked or hardly leaked according to an error of the nozzle or a state change of a liquid material, or even though the chemical liquid is ejected, there is a case where the linear shape is not maintained, but the chemical liquid is spattered and scattered. The checking jig 400 is used for checking presence of an inadequate ejection state by the user. The checking jig 400 is not used when the wafer W is processed by the processing liquid, but used to be mounted on the substrate processing apparatus 1 when the ejection of the processing liquid is checked in a state where the wafer W is not held by the substrate holding unit 21. For that reason, the checking jig 400 has a liquid receiving portion that receives the processing liquid ejected from the nozzle so that the processing liquid is not splashed and scattered therearound even though the processing liquid is ejected while the water W is not present.

In FIG. 4, a front nozzle liquid receiving portion 401 is to receive the first chemical liquid ejected from the first chemical liquid nozzle 73. A front nozzle liquid receiving portion 402 is to receive the second chemical liquid ejected from the second chemical liquid nozzle 83. A back nozzle liquid receiving portion 403 is to receive the first chemical liquid ejected from the third chemical liquid nozzle 90. A back nozzle liquid receiving portion 404 is to receive the second chemical liquid ejected from the fourth chemical liquid nozzle 95. A checking camera 405 is a CCD camera which may photograph a moving picture, and is installed below the back nozzle liquid receiving portion 403 to face a direction of the back nozzle liquid receiving portion 403. A checking camera 406 is a CCD camera which may photograph a moving picture, and is installed below the back nozzle liquid receiving portion 404 to face a direction of the back nozzle liquid receiving portion 404. In the exemplary embodiment, the CCD camera is used as the checking camera, but an image photographing device is not limited to the CCD, but may use other image photographing devices such as a CMOS sensor. A washing liquid supplying pipe 407 is divided to the front nozzle liquid receiving portion 401 and the front nozzle liquid receiving portion 402 to supply a washing liquid for washing each liquid receiving portion. A washing liquid supplying pipe 408 supplies a washing liquid for washing the back nozzle liquid receiving portion 403 and the back nozzle liquid receiving portion 404. Although not illustrated in FIG. 4, the checking jig 400 is provided with a pipe configured to connect the washing liquid supplying pipe 408 and the back nozzle liquid receiving portion 403 and the back nozzle liquid receiving portion 404. The jig sensor 410 is a sensor of the jig side corresponding to the a jig sensor 49 of an apparatus side, configured by a magnetic sensor, and used for detecting that the jig 400 is properly installed on the substrate processing apparatus 1. The units such as each liquid receiving portion or the cameras described above are fixed to a base 411, and a positional relationship of the units when the jig is installed and used is not changed. Further, the base 411 has a screw supporting portion 412 which is required for a fixing operation to be described below. Thereafter, a side where the washing liquid supplying pipe 408 is installed is called a front side of the checking jig 400, and a side where the checking cameras 405 and 406 are installed is called a rear side.

Figure 5A:
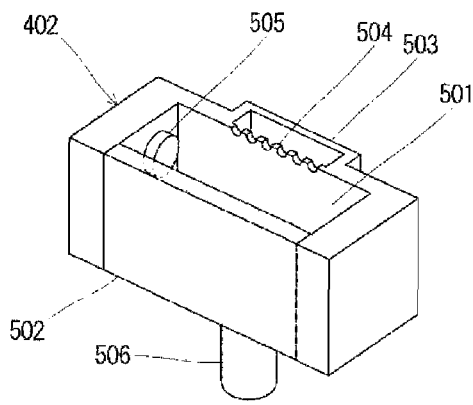
FIGS. 5A and 5B are perspective views illustrating a detailed configuration of a front nozzle liquid receiving portion.
Figure 5B:
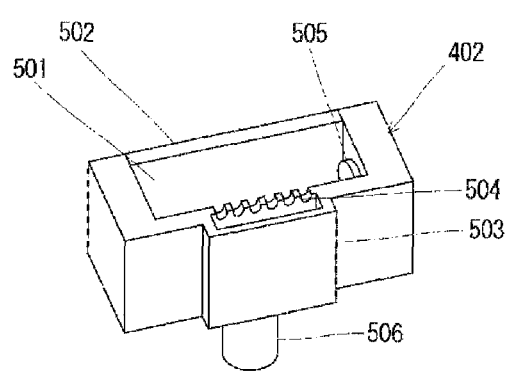

FIGS. 5A and 5B are views illustrating a detailed configuration of the front nozzle liquid receiving portion 402. FIG. 5A is a perspective view of the front nozzle liquid receiving portion 402 when viewed from the front side, and FIG. 5B is a perspective view of the front nozzle liquid receiving portion 402 when viewed from the rear side. The front nozzle liquid receiving portion 402 has an opening at the upper side so as to receive the second chemical liquid ejected from the second chemical liquid nozzle 83. A liquid receiving container 501 is a container for receiving the second chemical liquid ejected from the second chemical liquid nozzle 83. A front wall at least configuring the liquid receiving container 501 is a translucent wall 502, and the user may check the ejection state in the container through the transparent window of the maintenance panel 206 and the translucent wall 502. An overflow container 503 and an overflow wall 504 are used for an overflow washing process during a washing process to be described below. A washing liquid supplying port 505 is connected to the washing liquid supplying pipe 407 to supply the washing liquid into the liquid receiving container 501. A ejection port 506 ejects an ejection liquid received in the liquid receiving container 501 during ejection checking, and ejects the washing liquid filled in the liquid receiving container 501 or the overflow container 503 during washing. Meanwhile, the liquid receiving container 501 and the overflow container 503 have individual openings through the ejection port 506 at the bottom, respectively, and the size of the opening in the overflow container 503 is relatively larger than that of the liquid receiving container 501. Since the front end of the ejection port 506 faces the fringe portion 44, the ejected chemical liquid and washing liquid are guided into the cup body 3 like a general washing process, and finally, ejected to the outside of the substrate processing apparatus 1. Meanwhile, the front nozzle liquid receiving portion 401 is configured to be vertically symmetrical to the front nozzle liquid receiving portion 402.

Figure 6A:
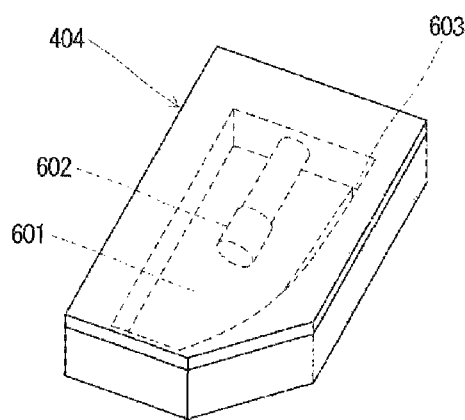
FIGS. 6A and 6B are perspective views illustrating a detailed configuration of a back nozzle liquid receiving portion.
Figure 6B:
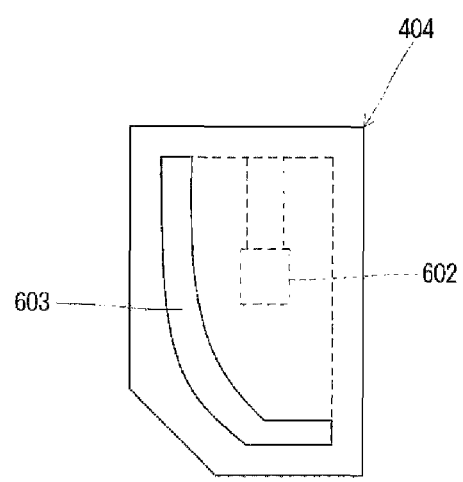

FIGS. 6A and 6B are views illustrating a detailed configuration of the back nozzle liquid receiving portion 404. FIG. 6A is a perspective view when viewed from the front side, and FIG. 6B is a plan view when viewed from the rear side. A liquid receiving chamber 601 is a space for receiving the second chemical liquid ejected from the fourth chemical liquid nozzle 95. A washing liquid nozzle 602 is connected with the pipe (not illustrated) described above to be connected to the washing liquid supplying pipe 408, and ejects the washing liquid to the liquid receiving chamber 601. A slit portion 603 is a gap formed at the bottom of the liquid receiving chamber 601 so that the second chemical liquid ejected from the fourth chemical liquid nozzle 95 may be penetrated into the liquid receiving chamber 601. As illustrated in FIG. 6B, the slit portion 603 is formed in a curved shape along an outer circumference of the wafer W, that is, in a direction to which the chemical liquid from the fourth chemical liquid nozzle 95 may direct. Meanwhile, other members except for the washing liquid nozzle 602 among the members which are illustrated in FIGS. 6A and 6B are configured by translucent materials, and a portion represented by a dotted line in FIGS. 6A and 6B corresponds to a visible portion through the translucent material. Meanwhile, the back nozzle liquid receiving portion 403 is configured to be vertically symmetrical to the back nozzle liquid receiving portion 404.

Figure 7:
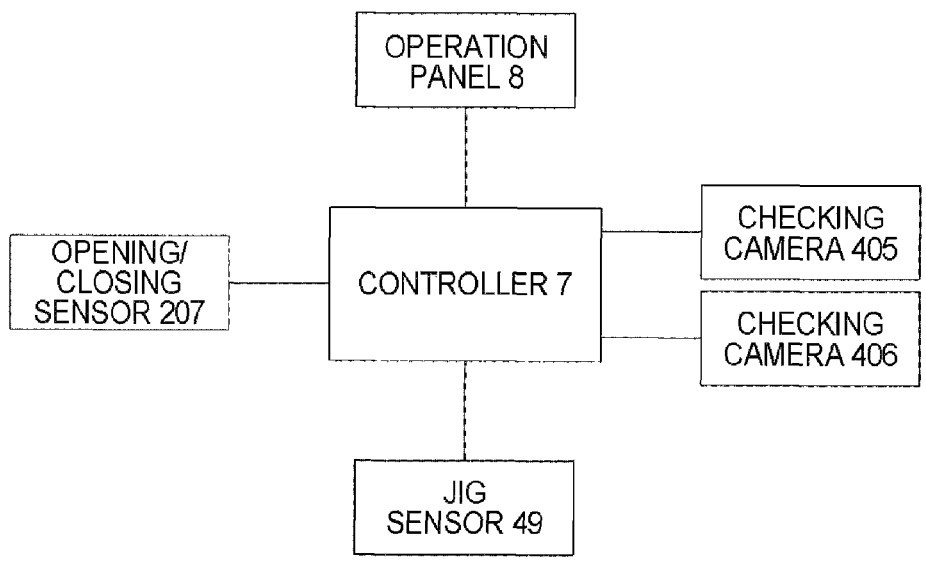
FIG. 7 is a block diagram illustrating an electric connection relationship of the substrate processing system.

FIG. 7 is a view illustrating an electrical connection relationship of the substrate processing system 100. The controller 7 is connected with the operation panel 8, the jig sensor 49 (jig sensor unit), the opening and closing sensor 207, and the checking cameras 405 and 406, in order to perform an ejection checking operation according to the exemplary embodiment. In the exemplary embodiment, any unit is wire-connected with the controller 7, but may be wirelessly connected. The controller 7 determines whether an operation mode of the system is transited to an ejection checking mode to be described below, based on a detection signal from the jig sensor 49 and a detection signal from the opening and closing sensor 207. Further, the controller 7 controls photographing parameters of the checking cameras 405 and 406, and acquires a moving picture signal obtained by photographing to convert the moving picture signal into moving picture data which may be displayed on the operation panel 8. Further, the controller 7 controls a screen display of the operation panel 8 to display the moving picture data acquired from the checking cameras 405 and 406 in real time. Further, the controller 7 may operate the substrate processing system 100 according to an operation input through the operation panel 8. For example, in the case where an ejection instruction of the chemical liquid is input from the operation panel 8, the substrate processing apparatus 1 controls the liquid to be ejected according to the instruction.

Figure 8:
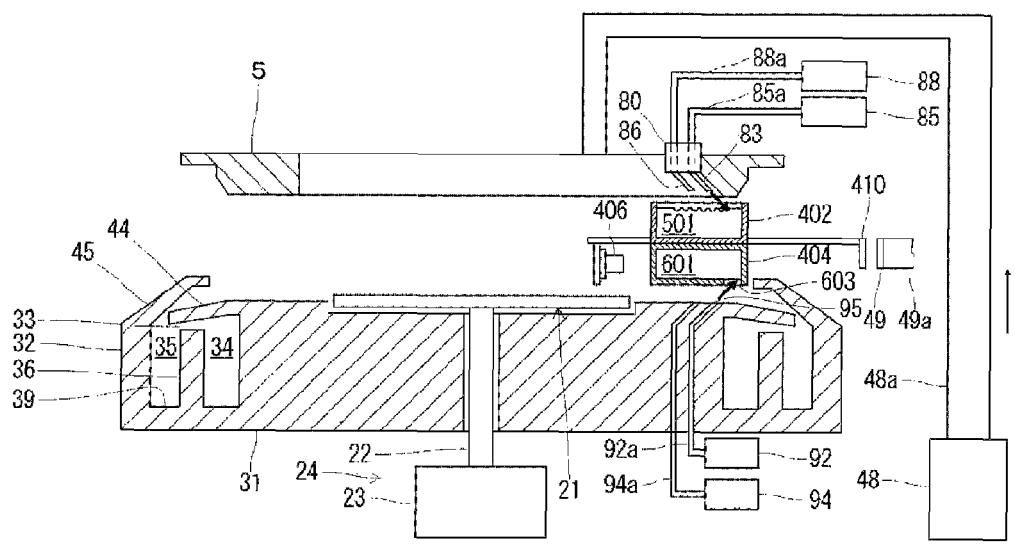
FIG. 8 is a longitudinal cross-sectional view illustrating a positional relationship of each unit when a checking jig is installed in the substrate processing apparatus.

FIG. 8 is a view illustrating a position relationship of the units in the case where the checking jig 400 is properly installed in the substrate processing apparatus 1. However, as described above, because FIG. 2 is vertically cross-sectional view viewed in the A-A' direction, the portion related with the back nozzle liquid receiving portion 404 is actually positioned at the rear side. In FIG. 8, the cover member 5 of the substrate processing apparatus 1 moves upward so as to install the checking jig 400. The second chemical liquid nozzle 83 moves upward with elevating of the cover member 5. The front nozzle liquid receiving portion 402 is disposed below the second chemical liquid nozzle 83, and the ejected chemical liquid moves downward as indicated by an arrow to be injected to the liquid receiving container 501. As illustrated in the drawing, the wafer W is not disposed on the substrate holding portion 21. For this reason, in the case where the chemical liquid is ejected from the fourth chemical liquid nozzle 95, the chemical liquid proceeds upward from a position below a surface on which the wafer W is disposed as indicated by an arrow. The back nozzle liquid receiving portion 404 is disposed above the fourth chemical liquid nozzle 95, and the chemical liquid ejected from the fourth chemical liquid nozzle 95 flows into the liquid receiving chamber 601 through the slit portion 603. Since the back nozzle liquid receiving portion 404 is configured by the translucent member, the checking camera 406 may photograph a state until the chemical liquid ejected from the fourth chemical liquid nozzle 95 flows into the liquid receiving chamber 601 and then contacts the wall surface. As described above, the jig sensor 410 of the checking jig side moves upward with the elevating of the elevation mechanism 48. When the checking jig 400 is properly installed, the jig sensor 410 faces the checking jig 400 at a height facing the jig sensor 49.

Figure 9:
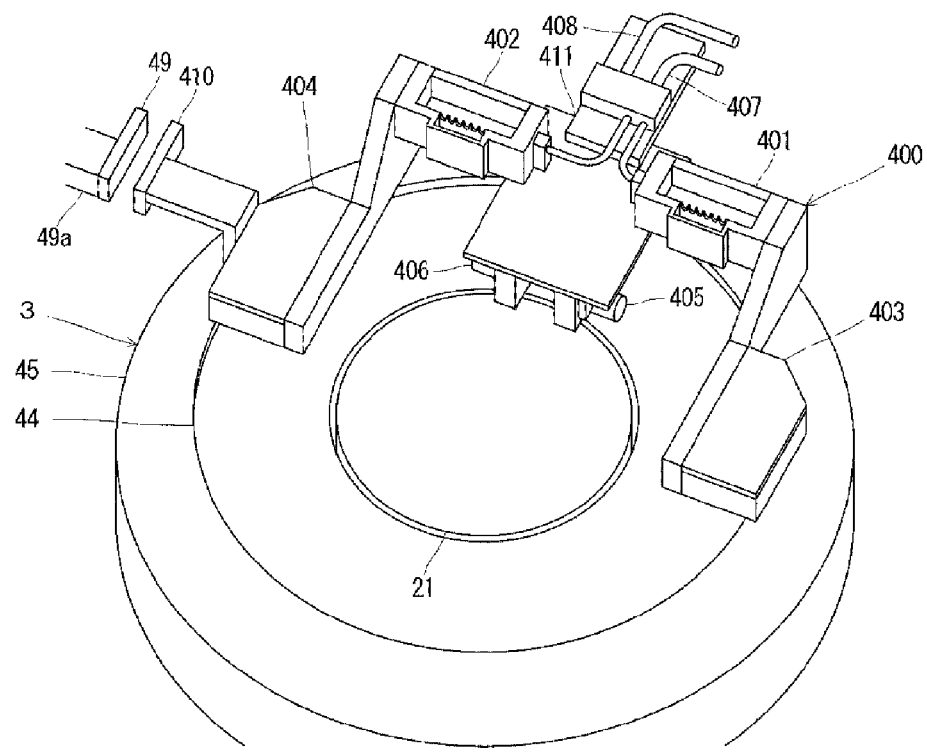
FIG. 9 is a perspective view illustrating the positional relationship of each unit when the checking jig is installed in the substrate processing apparatus.

FIG. 9 is a view illustrating a position relationship of the units viewed in a different direction in the case where the checking jig 400 is properly installed in the substrate processing apparatus 1. Meanwhile, in FIG. 9, the cover member 5 and the mechanism interlocked with the cover member 5 are omitted. In the processing chamber of the substrate processing apparatus 1, a supply channel connection portion (not illustrated) connecting the washing liquid supplying pipes 407 and 408 and an external processing liquid supplying source is included. Similarly, although not illustrated, a camera connecting portion wire-connecting the checking cameras 405 and 406 and the controller 7 is included. When the checking jig 400 is installed, the user closes the maintenance panel 206 after connecting the units and the connecting portion. Meanwhile, the supply channel connection portion and the camera connecting portion are installed for each processing chamber of the substrate processing apparatus 1 illustrated in FIG. 1 to be individually used.

Figure 10:
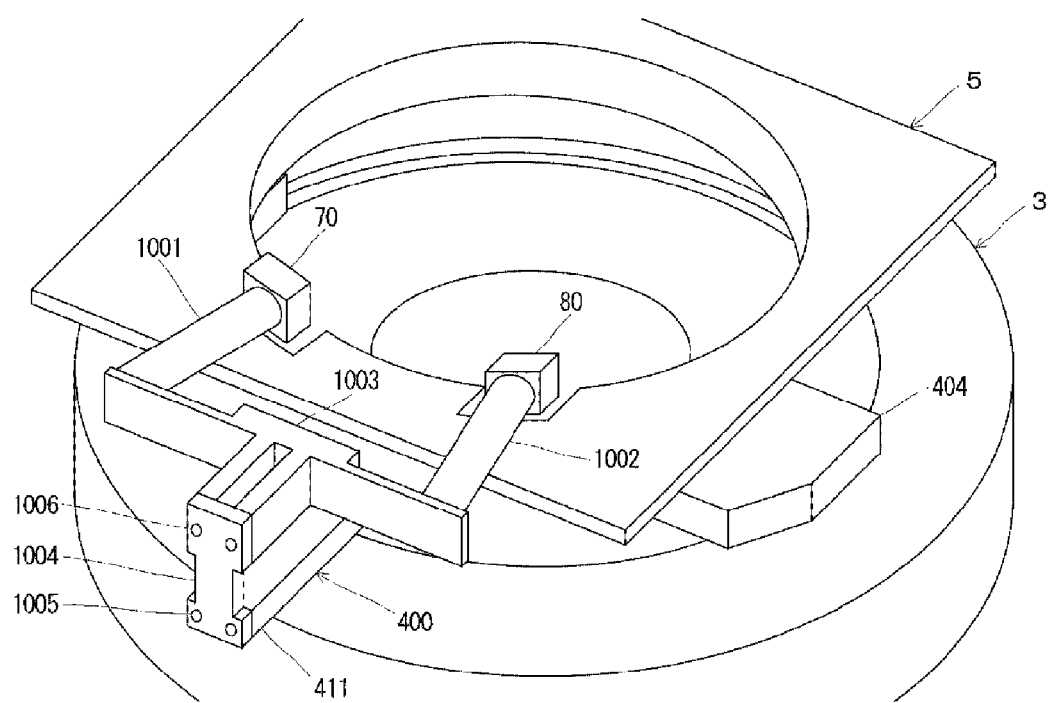
FIG. 10 is a perspective view illustrating a state where the checking jig is installed at a predetermined position of the substrate processing apparatus.

FIG. 10 is a view illustrating a state where the checking jig 400 is fixed to the substrate processing apparatus 1. In FIG. 10, the cover member 5 moves upward as illustrated in FIG. 8, and the checking jig 400 is installed between the cover member 5 and the cup body 3. Here, a nozzle unit 1001 configured by an arm by including the nozzle driving unit 70 and a nozzle unit 1002 including the nozzle driving unit 80 and the like similarly thereas are fixed to the cover member 5 by using a nozzle unit fixing member 1003. The checking jig 400 is fixed to a front end of a convex portion of the nozzle unit fixing member 1003 by using a jig fixing member 1004 during installation. In the exemplary embodiment, the checking jig 400 is fixed by using only the nozzle unit fixing member 1003, and a rear portion of the checking jig 400 is not fixed. However, the back nozzle liquid receiving portions 403 and 404 contact an external upper surface of the cover portion 45, and then the cover portion 45 supports a load applied to the rear side of the checking jig 400 from the bottom. As a result, since the load of the checking jig 400 is dispersed forward and rearward, the load is not excessively applied to the jig fixing member 1004. Accordingly, the jig fixing member 1004 may be made of a relatively cheap material without requiring a material having a strong intensity enough to support the entire weight of the checking jig 400. Further, in the exemplary embodiment, screws 1005 and 1006 are used as a coupling member of the jig fixing member 1004. Here, even before the installation, the checking jig 400 is coupled with the base 411 through the screw 1005 and a screw support portion 412. Accordingly, in the installation, the user completes the fixation by coupling the jig fixing member 1004 to the nozzle unit fixing member 1003 by using the screw 1006. Meanwhile, reference numeral 1006 may be configured by, for example, an attachment type coupling member having a nail shape, not a screw type coupling member.

Figure 11:
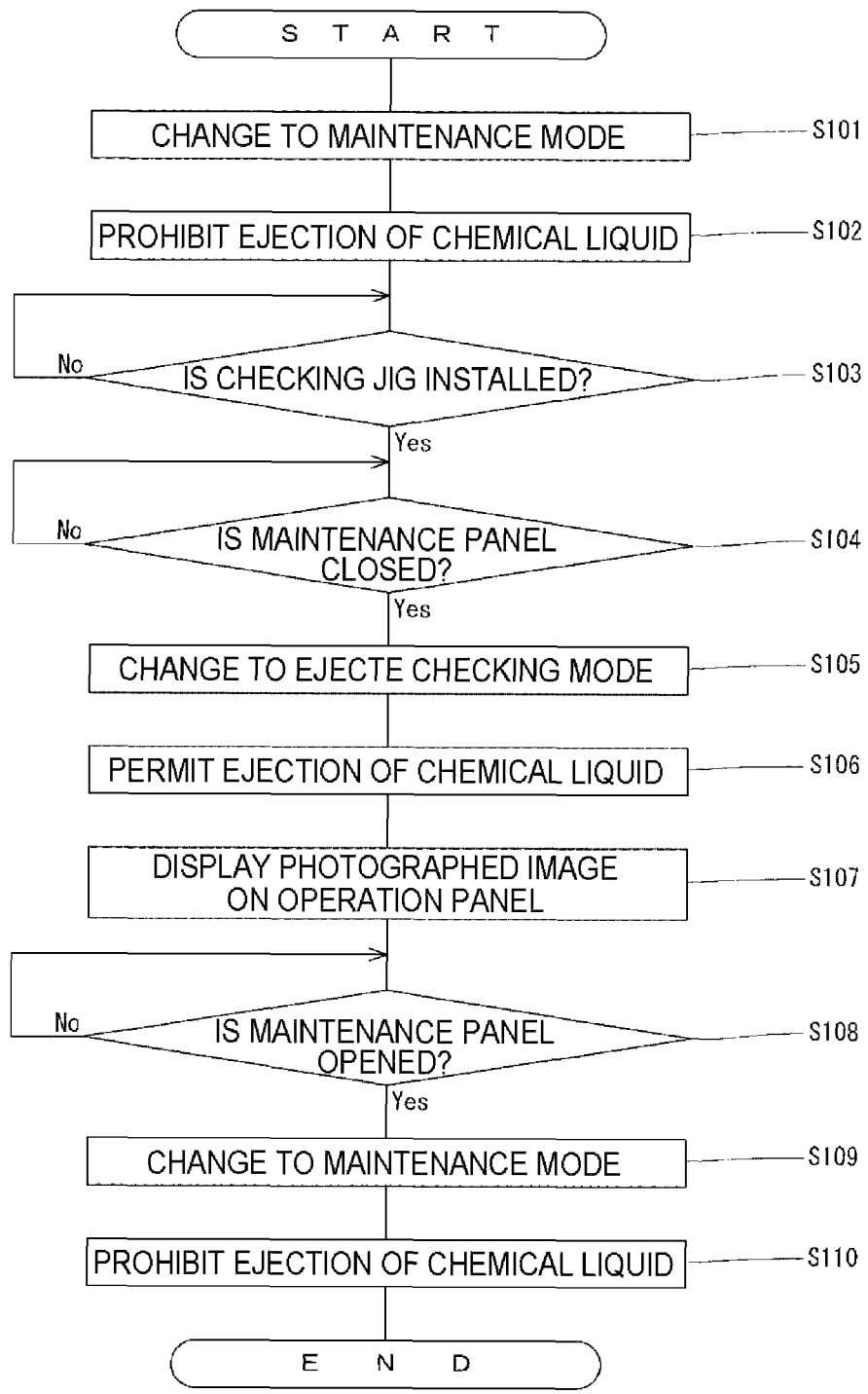
FIG. 11 is a flowchart illustrating an operation step depending on ejection checking of the substrate processing system.

FIG. 11 is a flowchart illustrating an operation step depending on ejection checking of the substrate processing system 100. The controller 7 executes a control program stored in a storage unit (not illustrated) of the controller 7 to achieve each step of the flowchart. The storage unit (not illustrated) is constituted by a storage medium such as a hard disk or a flash memory. Meanwhile, the control program may be provided by a storage medium such as a CD-ROM or a DVD-ROM and control programs stored in the storage media may be read by the system to be stored in a storage unit to perform the operation step.

First, according to an instruction input from the operation panel 8 in a general mode in which the substrate may be processed, the controller 7 transits an operation mode of the substrate processing system in a maintenance mode (step S101). In the maintenance mode, the user may check an operation of each unit in the processing chamber of each substrate processing apparatus 1. For example, the operation checking includes checking and adjustment of a rotating operation of the substrate holding unit 21, checking and adjustment of a holding operation of a vacuum chuck, checking and adjustment of a moving operation of the nozzle driving unit 80, checking and adjustment of an elevating operation of the cover member 5, and the like. The checkings and adjustments are executed by manually operating (UP, DOWN, rotating, and the like) a motor (not illustrated) of each unit in each coordinate axis direction by using, for example, the operation panel 8.

When the operation mode is transited to the maintenance mode, the controller 7 prohibits the chemical liquid from being ejected (step S102). For example, there is a specification that although the operation panel 8 instructs ejecting the chemical liquid, the controller 7 does not accept the instruction, but displays an error. In such a state, the user opens the maintenance panel 206 to check various apparatuses or check operations of the various apparatuses in the processing chamber. Accordingly, when checking various apparatuses or checking the operations of various apparatuses in the processing chamber is performed, the chemical liquid is not wrongly ejected into the processing chamber. Further, in this state, the user may install the checking jig 400 in the processing chamber. That is, in the exemplary embodiment, the chemical liquid is prohibited from being wrongly ejected into the processing chamber even while the user performs installation work, similarly as the adjustment and the checking work. In the maintenance mode, all processing liquids are prohibited from being ejected by prohibiting even ejecting a rinse liquid (distilled water) as well as ejecting the chemical liquid. Meanwhile, the control may be performed in such a manner that ejecting all of the processing liquids is not prohibited, and ejecting only an acid or alkali chemical liquid in which a chemical reaction or corrosion may occur is prohibited and ejection of the almost neutral distilled water (rinse liquid) in which the chemical reaction or the corrosion may not occur is permitted.

The controller 7 determines whether the checking jig 400 is installed by the user (step S103). In the exemplary embodiment, when the jig sensor 49 and the jig sensor 410 are in contact with each other as illustrated in FIGS. 8 and 9, a predetermined detection signal is transmitted to the controller 7 from the jig sensor 49. When the controller 7 receives the detection signal from the jig sensor 49, the controller 7 determines that the checking jig 400 is installed.

Next, the controller 7 determines whether the maintenance panel 206 is closed (step S104). When the maintenance panel 206 is closed, the predetermined detection signal is transmitted to the controller 7 from the opening/closing sensor 207. When the controller 7 receives the detection signal from the opening/closing sensor 207, the controller 7 determines that the maintenance panel 206 is closed.

When conditions of step S103 and step S104 are satisfied, the controller 7 makes the substrate processing system 100 to be transited to the ejection checking mode from the maintenance mode (step S105).

When the operation mode is changed to the ejection checking mode, the controller 7 changes the ejection of the chemical liquid prohibited in the maintenance mode to be enabled (step S106). Meanwhile, in the ejection checking mode, the ejection of the rinse liquid (distilled water) as well as the ejection of the chemical liquid is enabled to permit all processing liquids to be ejected.

After the operation is transited to the ejection checking mode, when connection with the checking cameras 405 and 406 is detected, the controller 7 accepts a signal of a moving picture photographed by the checking cameras 405 and 406 and converts the accepted signal to displayable image data to be displayed on the operation panel 8 (step S107).

FIGS. 12A and 12B illustrate an example of a display screen of the operation panel 8. The screen 1200 displays the moving image photographed by the checking camera 406 in real time. Herein, an image acquired by photographing a state of a second chemical liquid ejected from a fourth chemical liquid nozzle 95 is displayed. It is displayed that the present operation mode is the ejection checking mode, in an area of a left screen frame 1201. The user operates an ejection amount setting screen (not illustrated) displayed by touching a menu button 1202 to determine an ejection amount from each nozzle. Further, when the user touches a chemical liquid ejection button 1203, the controller 7 receives an ejection instruction from the operation panel 8 to transmit an ejection command to an ejection mechanism. As a result, the user may continuously check a response ejection to the instruction while viewing the screen 1200. A camera change-over button 1204 is used to change over the moving image displayed on the display screen 1200 between the checking cameras. In the ejection checking mode, the controller 7 prepares for transmitting the moving image from both the checking cameras 405 and 406. When the change-over instruction is received from the camera change-over button 1204, the controller 7 displays moving image data from a change-over target camera onto the operation panel 8.

As described above, although ejection checking work for checking the ejection state of the fourth chemical liquid nozzle 95 by the camera has been described, the third chemical liquid nozzle 90 may be described similarly. Meanwhile, the checking work of the ejection states of the first chemical liquid nozzle 73 and the second chemical liquid nozzle 83 is performed with eyes without using the cameras. As described above, the maintenance panel 206 is provided with a transparent window (not illustrated) and a front side of the front nozzle liquid receiving portion 401 is a semi-transparent wall 502. The user displays a front nozzle checking screen by pressing the menu button 1202 of the operation panel 8 and operates a chemical liquid ejection button (not illustrated, but similar as the chemical liquid ejection button 120) displayed on the screen to check the ejection state through the transparent window. Meanwhile, as described below, after a desired ejection checking work is ended, the user may perform a work of washing the ejection checking jig 400 without pulling out the ejection checking jig 400 from the inside of the processing chamber of the substrate processing apparatus 1.

The ejection checking work and the jig washing work are performed after executing step S107, but the controller 7 continuously determines whether the maintenance panel is closed even while the user performs the ejection checking work and the jig washing work (step S108). For example, when the user opens the maintenance panel 206 in order to pull out the checking jig 400 after completely performing the ejection checking work and the jig washing work, the predetermined signal is transmitted to the controller 7 from the opening/closing sensor 207 and the controller 7 determines that the maintenance panel 206 is opened according to the signal.

Thereafter, the controller 7 transits the operation mode of the system to the maintenance mode from the ejection checking mode (step S109). In addition, the controller 7 prohibits the chemical liquid from being ejected, similarly as in step S102 (step S110). Meanwhile, when the user instructs ejection on the operation panel after setting steps S102 and S110, the controller 7 may notify an intent that ejecting the chemical liquid is impossible by issuing an error display as illustrated in FIG. 12B. Further, the chemical liquid ejection button 1203 is displayed as being grayed-out to make an operation input to be impossible.

After step S110, since the chemical liquid is not wrongly ejected, the user may safely pull out the checking jig 400 from the processing chamber. Further, similarly as in step S101, various works may be performed in the maintenance mode.

Subsequently, the jig washing work which is possible in the ejection checking mode will be described in detail. In the exemplary embodiment the washing work is achieved just by adjusting a washing liquid supply amount from the washing liquid supplying port 505 and the washing liquid nozzle 602. Herein, the supply amount is adjusted by a manual operation of the user by using a flow adjustment valve (not illustrated) positioned between a supply channel connection portion and a processing liquid supplying source.

FIGS. 13A to 13E are views illustrating a washing sequence of front nozzle liquid receiving portions 401 and 402. In an initial state of the liquid receiving portion herein, the chemical liquid by the ejection checking is attached to the bottom and the wall surface of the liquid receiving container 501.

First, as illustrated in FIG. 13A, the washing liquid is supplied from the washing liquid supplying port 505. Herein, a supply amount of the washing liquid is larger than an ejection amount from the ejection port 506 to retain only a small amount of washing liquid in the container and primarily wash the bottom of the liquid receiving container 501. After a predetermined time elapses, supplying the washing liquid from the washing liquid supplying port 505 is stopped, and as a result, the washing liquid is not retained in the container as illustrated in FIG. 13B.

Subsequently, as illustrated in FIG. 13C, the washing liquid is supplied from the washing liquid supplying port 505 again. Herein, the washing liquid is supplied for a time longer than the supply time in FIG. 13A. The washing liquid that is filled in the container is ejected from the ejection port 506 and since the supply time is long, the washing liquid is slowly retained in the container.

In addition, when the washing liquid is retained up to a state illustrated in FIG. 13D, the washing liquid flows out to the overflow container 503 through the overflow wall 504. As described above, by performing overflow washing processing, the chemical liquid in the container does not remain and thus a sufficient washing effect may be acquired.

After overflow washing is performed for a predetermined time, supplying the washing liquid from the washing liquid supplying port 505 is stopped, and as a result, all of the washing liquids are ejected from the container as illustrated in FIG. 13E.

Figure 14:
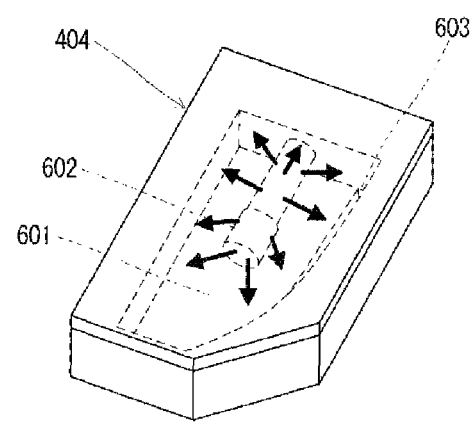
FIG. 14 is a perspective view illustrating a washing operation of a back nozzle liquid receiving portion.

FIG. 14 is a view for describing washing operations of back nozzle liquid receiving portions 403 and 404. A plurality of ejection holes are formed on the surface of the washing liquid nozzle 602 and the washing liquid nozzle 602 ejects the washing liquid from the ejections holes omnidirectionally during the washing work. Although a flow of the washing liquid is constant, the flow may be changed by slowly decreasing the flow. The chemical liquid attached to the wall surface of the liquid receiving chamber 601 is washed by the washing liquid and the used washing liquid is ejected from the slit portion 603 to the outside.

As described above, in the ejection checking mode, the ejection of the washing liquid for washing the checking jig 400 is also permitted. Meanwhile, in the maintenance mode, the ejection of the washing liquid for washing the checking jig 400 is also prohibited. The washing of the checking jig 400 may be performed in the ejection checking mode as described above, or the processing may be controlled not to wrongly ejects the chemical liquid while washing the checking jig 400 by permitting only the ejection of the washing liquid while prohibiting the ejection the processing liquid by setting a jig washing mode separately from the ejection checking mode.

The above description relates to a washing work of each liquid receiving portion performed by the manual operation of the user. However the washing work is not limited to this example and the controller 7 automatically controls the opening/closing of the valve of the washing liquid based on the information while storing flow adjustment sequence information in advance to achieve the washing work of FIGS. 13A to 13E and 14.

As described above, in the exemplary embodiment, when it is detected that the checking jig 400 is installed at the predetermined position of the substrate processing apparatus 1 in the state where the ejection of the processing liquid from the nozzle is prohibited in the maintenance mode, the operation mode is transited to the ejection checking mode to permit the ejection of the processing liquid from each nozzle. As a result, a dedicated ejection checking unit need not be installed in the processing chamber to avoid enlargement of the apparatus. Further, since the ejection of the processing liquid is prohibited in the maintenance mode, the processing liquid is not wrongly ejected into the processing chamber at the time of performing the work of installing the checking jig 400 in the substrate processing apparatus 1. In addition, since the operation mode is automatically transited from the maintenance mode to the ejection checking mode only when the checking jig 400 is installed at an appropriate place, even an unskilled user may simply and certainly check the ejection of the processing liquid from the nozzle without ejecting the processing liquid to an intended place in the processing chamber.

Since even closing the maintenance panel 206 is set as a transition condition to the ejection checking mode, and opening the maintenance panel 206 is set as a transition condition from the ejection checking mode to the maintenance mode, and the ejection of the processing liquid from the nozzle may be checked in a more certain state without wrongly pulling out the checking jig 400.

In the ejection checking mode, since the processing liquid may be ejected while viewing the real-time moving image from the camera displayed on the operation panel 8, the ejection may be more accurately checked. In particular, since the back nozzle is installed at a position below the wafer in the cup body 3 and the processing liquid is ejected upward from the position, the liquid receiving portion is required so as to prohibit the processing liquid in the processing chamber from being splashed and scattered. Moreover, the liquid receiving portion is preferably installed to cover the back nozzle from the top, and since the back nozzle is positioned inside the maintenance panel, it is very difficult for the user to check the back nozzle outside the processing chamber. However, according to the exemplary embodiment, since the checking cameras 405 and 406 are provided on the bottom of the base 411 of the checking jig 400, that is, at a position adjacent to the back nozzle, the ejection from the back nozzle which is difficult for the user to check with his/her eyes may be certainly checked outside the processing chamber.

As described in the exemplary embodiment, in the structure of the checking jig 400, when the checking jig 400 is appropriately installed in the substrate processing apparatus 1, the liquid receiving portion is positioned in the ejection direction of the processing liquid from the nozzle and the jig sensor (jig sensor 410) is positioned at a place to face the jig sensor (jig sensor 49) of the substrate processing apparatus 1. Accordingly, the processing liquid from the nozzle may be certainly received by the liquid receiving portion. Further, since the back nozzle liquid receiving portion has a curved slit so that the processing liquid ejected from the bottom easily penetrates the liquid receiving chamber, the processing liquid may be more certainly received without leaking to the outside.

Since the front nozzle liquid receiving portions 401 and 402 and the back nozzle liquid receiving portions 403 and 404 are installed in two to be bilaterally symmetric, for example, since respective acid and alkalic chemical liquids may be individually received, a chemical reaction by mixing of the chemical liquids may be prohibited.

As described in the exemplary embodiment, since the checking jig 400 is simply fixed to the cover member 5 by one fixing member, the checking jig 400 may be provided without increasing cost. Further, the user may simply and rapidly perform a fixing work and a removal work.

As described in the exemplary embodiment, in the substrate processing system 100, a connector of a supply path of the washing liquid is individually provided in each processing chamber to wash the checking jig 400. Since the washing work may be executed while closing the maintenance panel 206 without pulling out the checking jig 400 after the ejection checking work, the user may be efficiently perform a series of sequences of the ejection checking work to the jig washing work by a very simple operation. Further, since the washing has already been ended at the time of pulling out the checking jig 400 the substrate processing apparatus 1 or the surrounding thereof is not made dirty. In addition, in the checking jig 400, since each liquid receiving portion is provided with the washing supply hole and the front nozzle liquid receiving portions 401 and 402 may perform overflow washing and the back nozzle liquid receiving portions 403 and 404 enable omnidirectional ejection washing by the nozzle, the user may achieve sufficient washing by a simple operation of adjusting a supply flow and a supply time of the washing liquid.

In the exemplary embodiment, an example of checking the ejection sate of the chemical liquid from each chemical liquid nozzle has been described, but the present disclosure is not limited thereto and may be applied even when checking the ejection state of the rinse processing liquid from each rinse nozzle. That is, a type of the processing liquid ejected from the nozzle is not limited.

The substrate processing apparatus 1 according to the present disclosure is also not limited to an apparatus for processing the peripheral portion of the wafer W such as the exemplary embodiment and if the substrate processing apparatus 1 is a substrate processing apparatus that performs ejecting the processing liquid for resist application or for scrub washing, the present disclosure may be applied similarly.

The exemplary embodiment discloses a control sequence of an ejection checking operation depending on transition of the operation mode between the maintenance mode and the ejection checking mode in the substrate processing system 100. However, if the present disclosure is not limited thereto and prohibition and permission of the ejection of the processing liquid is changed over by appropriate installation of the checking jig 400, the present disclosure may applied even to a system having a mode definition different from the exemplary embodiment or a system without a definite mode definition.

In the exemplary embodiment, as the checking cameras 405 and 406, cameras having a moving image photographing function are used, but for example, a camera having a function to photograph a still image may be used. In this case, the controller 7 may allow the photographed image acquired by controlling the camera to perform consecutive photographing at a predetermined interval to be displayed or allow the photographed image to be displayed by controlling the camera to photograph the image when there is an instruction of the user from the operation panel.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing system including a substrate processing apparatus that includes a nozzle configured to eject a processing liquid to a substrate, the system comprising:
 a jig sensor configured to detect whether a checking jig provided with a liquid receiving unit receiving the processing liquid ejected from the nozzle and configured to check an ejection state of the processing liquid from the nozzle is installed at a predetermined position of the substrate processing apparatus; and
 a controller configured to control the ejection of the processing liquid from the nozzle,
 wherein when the controller determines that the checking jig is installed at the predetermined position of the substrate processing apparatus based on detection of the jig sensor in a state where the ejection of the processing liquid from the nozzle is prohibited, the controller permits the ejection of the processing liquid from the nozzle.

2. The system of claim 1, wherein the controller is capable of changing an operation mode between a maintenance mode that prohibits the ejection of the processing liquid from the nozzle to perform a maintenance of the inside of the substrate processing apparatus and an ejection checking mode that permits the ejection of the processing liquid from the nozzle to check an ejection state of the processing liquid from the nozzle, and when it is detected by the jig sensor detects that the checking jig is installed at the predetermined position of the substrate processing apparatus in a state where the operation mode is set to the maintenance mode, the controller changes the operation mode from the maintenance mode to the ejection checking mode to permit the ejection of the processing liquid from the nozzle.

3. The system of claim 2, wherein the substrate processing apparatus further includes an opening/closing panel and an opening/closing sensor configured to detect an opening/closing of the opening/closing panel, and when the controller determines that the checking jig is installed at the predetermined position of the substrate processing apparatus based on the detection of the jig sensor in the state where the operation mode is set to the maintenance mode and determined that the opening/closing panel is closed based on the detection of the opening/closing sensor, the controller changes the operation mode from the maintenance mode to the ejection checking mode.

4. The system of claim 3, wherein when it is detected that the opening/closing panel is opened by the opening/closing sensor in a state where the operation mode is set to the ejection checking mode, the controller changes the operation mode from the ejection checking mode to the maintenance mode.

5. The system of claim 2, wherein the substrate processing apparatus further includes an operation device for a user to operate the ejection of the processing liquid, and the controller controls the ejection of the processing liquid from the nozzle according to an operation input from the operation device in the ejection checking mode.

6. The system of claim 5, wherein the checking jig is provided with a camera for photographing the ejection state of the processing liquid from the nozzle, and the controller displays an image acquired by the camera on the operation device in the ejection checking mode.

7. The system of claim 6, wherein the substrate processing apparatus is provided with a back nozzle configured to eject the processing liquid to the bottom of the substrate, and the camera photographs the back nozzle at the time of installing the checking jig.

8. The system of claim 1, wherein the checking jig is further provided with a jig-side corresponding sensor corresponding to the jig sensor, and when the checking jig is installed at the predetermined position of the substrate processing apparatus, the liquid receiving portion is positioned in an ejection direction of the processing liquid from the nozzle and the jig-side corresponding sensor faces the jig sensor.

* * * * *